United States Patent
Fujita et al.

[11] Patent Number: 6,157,047
[45] Date of Patent: Dec. 5, 2000

[54] LIGHT EMITTING SEMICONDUCTOR DEVICE USING NANOCRYSTALS

[75] Inventors: Shinobu Fujita; Atsushi Kurobe, both of Kanagawa-ken, Japan

[73] Assignee: Kabushiki Kaisha Toshiba, Kawasaki, Japan

[21] Appl. No.: 09/143,106

[22] Filed: Aug. 28, 1998

[30] Foreign Application Priority Data

Aug. 29, 1997 [JP] Japan ................................... 9-234284
Jun. 25, 1998 [JP] Japan .................................. 10-178278

[51] Int. Cl.$^7$ ................................................. H01L 29/00
[52] U.S. Cl. ............................... 257/51; 257/50; 257/78; 257/94; 257/88; 257/90; 257/200; 257/290; 257/347
[58] Field of Search ....................... 257/50–65, 347–355, 257/78, 88, 94, 90, 200, 290

[56] References Cited

PUBLICATIONS

K. Chen et al., "Visible Electroluminescenscence From Crystallized a–SiH/a–SiN$_x$:H Multiquantum Well Structures", Journal of Non–Crystalline Solids, 198–200, p. 833–836 (1996).

G.S. Tompa et al., "UV–Visible–IR Electroluminescence From Si and Ge Nanocrystals in a Wider Bandgap Matrix", Mat. Res. Soc. Symp. Proc., vol. 358, p. 710–706, (1995).
L. Liao et al., "Visible Electroluminescence From Si$^+$–Implanted Sio$_2$ Films Thermally Grown on Crystalline Si", Solid State Communications, 97(12), pp. 1039–1042 (1996).

*Primary Examiner*—Fetsum Abraham
*Attorney, Agent, or Firm*—Finnegan, Henderson, Farabow, Garrett & Dunner, L.L.P.

[57] ABSTRACT

A device structure provides improved efficiency of light emission from a light emitting element made of silicon while rendering such emission electrically controllable. Silicon in the light emitting element comprises fine microcrystals, which are miniaturized sufficiently to cause a quantum size effect. The microcrystals may be 10 nanometers (nm) or less in grain size. A dielectric film of 5 nm thick or less is formed containing therein such microcrystals. The microcrystal structure section is disposed between p- and n-type semiconductor layers. These layers are brought into electrical contact with the microcrystal structure only, while causing the remaining portions to be electrically insulative by a dielectric film or the like. Elementary particles of the opposite polarities, e.g. electrons and holes, are injected by tunnel effect into the microcrystals resulting in emission of light rays with increased efficiency.

20 Claims, 15 Drawing Sheets

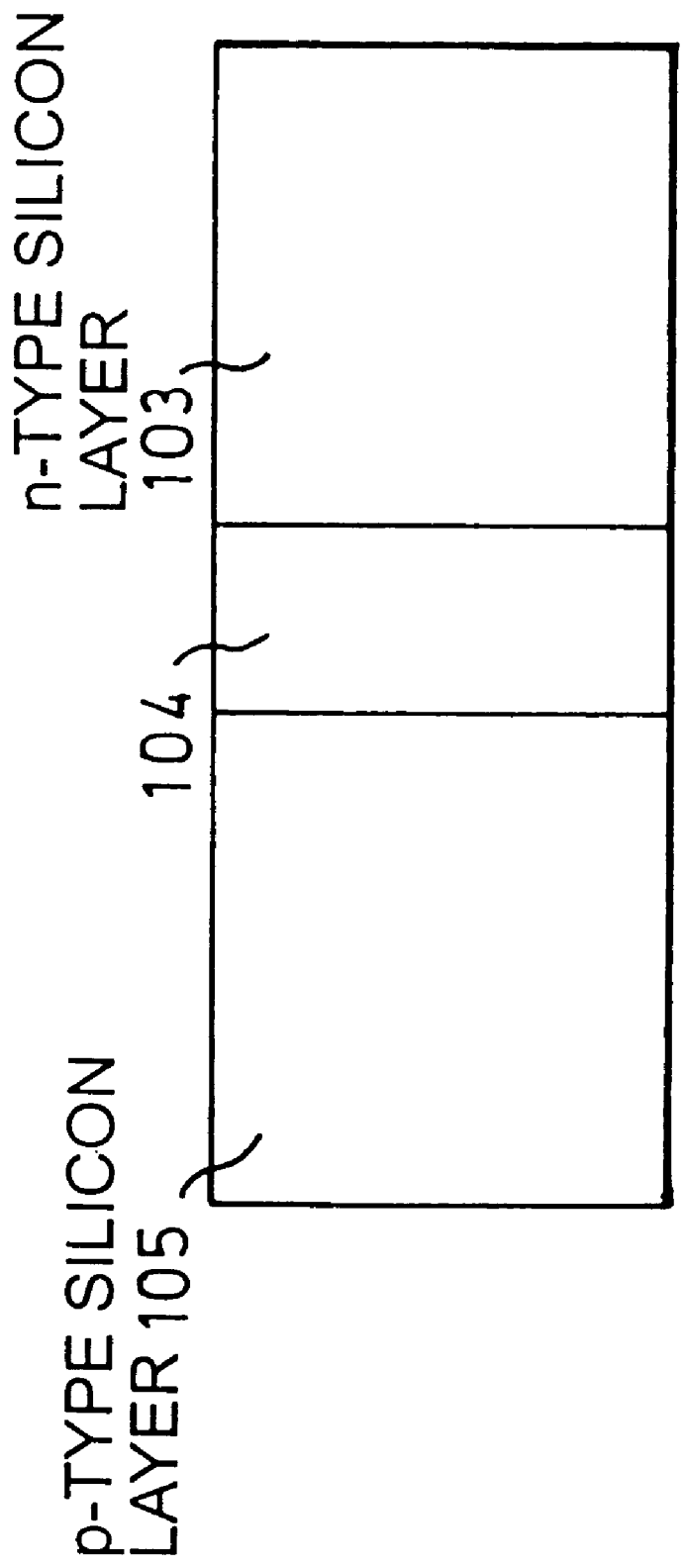
F I G. 11

LIGHT EMITTING SEMICONDUCTOR DEVICE USING NANOCRYSTALS

BACKGROUND OF THE INVENTION

1. Field of the Invention

The present invention relates generally to semiconductor devices, and, more particularly, to semiconductor devices using Group IV semiconductors for light emission upon application of a voltage thereto.

2. Discussion of the Background

Conventional semiconductor light emitting devices are made of chosen materials using Column III-V compound semiconductors including arsenide (As) and phosphorus (P). However, most semiconductor device components for typical use with central processor units (CPUs) and memories are designed to employ silicon (Si), which in turn makes it difficult to monolithically fabricate the semiconductor light emitting devices on a Si substrate along with a CPU and memories. Also, since Si substrates are low in cost, a need exists for development of light emitting elements that are implemented on a Si substrate used as a base plate.

However, Si is an indirect transition type semiconductor which has low light emission efficiency. This results in insufficient light emission in semiconductor light emitting elements with the pn junction of Si simply formed on a Si substrate.

On the contrary, those materials fabricatable on Si substrates include silicon-germanium (SiGe). Although studies are continuing while expecting SiGe to be of the direct transition type, devices with increased luminous efficacy have not yet been developed.

Porous Si filled with pores through etching of the surface of a Si substrate might exhibit strong photo-luminescence light emission at room temperatures. However, the luminous efficiency is extremely low relative to the amount of current injection and is unstable in characteristic. For this reason, porous Si has not been successfully reduced to practice.

Attainability of optically pumped light emission (photoluminescence emission) has been discussed in X. Zhao et al., Japanese Journal of Applied Physics, Vol. 33, L649 (1994). This paper discloses that relatively strong photoluminescence in regions of the spectrum from ultraviolet rays to blue light at room temperatures is observable from Si microcrystals in diameter of 5 nanometers (nm) or less, which were fabricated by heating amorphous Si.

Another report, (Z. H. Lu et al., Nature, Vol. 378, 258 (1995)) shows that relatively strong photoluminescence emission was observed from a super-lattice structure at room temperature. The structure was formed by alternate growth of amorphous Si of several nanometers in thickness and Si oxide films.

Unfortunately, the prior known approaches merely provide device structures with photoluminescence emittability alone. These structures remain incapable of emitting light by current injection and thus lack electrical controllability.

One exemplary light emission device is disclosed in a paper, K. Chen et al., J. Non-Cryst. Solids, 198, 833 (1996). The device disclosed was obtained by forming a multilayer superlattice with a lamination of amorphous Si thin-films and nitrided Si thin-films, heating the lamination for partial recrystallization, and then simply providing electrodes thereon. Two problems are encountered with this approach. The luminous efficacy is low due to increased deviation of size and density of microcrystals because uniform heat application using laser thermal processing is unattainable. Another problem is that the device requires the use of high potential voltages such as 25 volts or above because the multilayer lamination is 200 nm or greater in thickness.

Still another example of a prior art light emittable device is disclosed in Published Japanese Patent Application No. 5-218499 (JP-A-5-218499). This device is designed to provide light emission by locally enhancing the quantum entrapment/confinement effect by use of p-type Si and n-type Si contacted together on the order of several nanometers in size. A further example of prior art is disclosed in JP-A-6-140669, wherein p- and n-type impurity-doped layers with fine lines approximately 10 nm wide or narrower (quantum microlines) are contacted together in a side-by-side manner permitting holes and electrons to be injected from the p- and n-type regions, respectively, for recombination at a junction section leading to emission of light rays (electroluminescence).

The above-referenced prior art approaches are inherently directed to providing the hetero-junction structure with semiconductor microlines directly contacted with other semiconductor layers. A problem associated with this type of structure is that the surrounding semiconductor sections are substantially greater in band gap than the semiconductor sections. This makes it very difficult for electrons and holes to be efficiently injected into the junction section. Even where the electrons and holes might be injected, these can leak to the outside resulting in insufficient luminous efficacy.

As described above, the prior art Si-base semiconductor light emitting devices do not achieve sufficient efficiency of light emission.

SUMMARY OF THE INVENTION

An object of the present invention is therefore to provide a new and improved semiconductor device using Si with increased light emission efficiency.

Another object of the present invention is to provide an improved Si-based semiconductor device capable of electrically controlling light emission.

To attain the foregoing objects, the present invention provides a semiconductor device which includes a p-type Group IV semiconductor layer, a semiconductor microcrystalline layer formed on the p-type Group IV semiconductor layer and containing more than one semiconductor fine crystal with a surface covered by a high-resistivity or insulative film greater in resistivity than the semiconductor microcrystalline layer, and an n-type Group IV semiconductor layer formed on the semiconductor microcrystalline layer. The semiconductor microcrystalline layer is sized to exhibit quantum confinement effect thereby permitting electrons and holes, upon application of a voltage between the p-type Group IV semiconductor layer and the n-type Group IV semiconductor layer, to tunnel through the high-resistivity or insulative film to be injected into the semiconductor microcrystalline layer so that the electrons and holes are recombined together for emission of light.

In accordance with one aspect of the present invention, the semiconductor device is such that the semiconductor fine crystal comprises silicon.

In accordance with another aspect of the present invention, one of the p- or n-type Group IV semiconductors comprises silicon.

The present invention also provides a semiconductor device including a p- or n-type Group IV semiconductor layer, a semiconductor microcrystalline layer formed on the p- or n-type Group IV semiconductor layer and including semiconductor microcrystals with surfaces covered by a high-resistivity or dielectric film higher in resistivity than the semiconductor, and a metal layer formed on the semiconductor microcrystalline layer. The semiconductor microcrystalline layer is sized to exhibit quantum confinement effect thereby permitting electrons and holes, upon application of a voltage between the p- or n-type Group IV semiconductor layer and the metal layer, to tunnel through the high-resistivity or dielectric film to be injected into the semiconductor microcrystalline layer so that the electrons and holes are recombined together for emission of light.

In one embodiment the semiconductor device is such that the semiconductor microcrystals comprise silicon.

The Group IV semiconductor layer of p- or n-type conductivity comprises silicon.

The high-resistivity or dielectric film may be 5 nm or less in thickness whereas the semiconductor microcrystals are 10 nm or less in size.

The semiconductor microcrystalline layer may contain therein holes in a volume equal to or less than five percent of a volume of the layer.

In accordance with a further aspect of the present invention, a semiconductor device is provided, which includes as its light emission layer a plurality of semiconductor microcrystalline layers. Each layer is equivalent to the semiconductor microcrystalline layer, wherein a total thickness of the microcrystal layers is 80 nm or less.

The present invention also provides a semiconductor device which includes a p-type Group IV semiconductor layer, a semiconductor fine-line layer formed on the p-type Group IV semiconductor layer and including more than one semiconductor fine line with a surface covered by an insulative film, and an n-type Group IV semiconductor layer formed on the semiconductor fine-line layer. The semiconductor fine-line layer is sized to exhibit a quantum confinement effect thereby permitting electrons and holes, upon application of a voltage between the p-type Group IV semiconductor layer and the n-type Group IV semiconductor layer, to tunnel through the insulative film for injection into the semiconductor fine-line layer so that the electrons and holes are recombined together for emission of light.

The present invention further provides a semiconductor device which includes a Group IV semiconductor layer of p- or n-type conductivity, a semiconductor microline layer formed on the Group IV semiconductor layer and including a semiconductor microline with a surface covered by an insulative film, and a metal layer formed on the semiconductor microline layer. The semiconductor microline layer is sized to exhibit a quantum confinement effect thereby causing electrons and holes, upon application of a voltage between the Group IV semiconductor layer and the metal layer, to tunnel through the insulative film into the semiconductor microline layer for recombination to thereby emit light.

The semiconductor device may include a light emission layer having a plurality of semiconductor microcrystalline layers, each equivalent to the semiconductor microcrystalline layer, and having a total thickness of 80 nm or less.

Preferably, the semiconductor device is such that the insulative film is 5 nm or less in thickness, and the semiconductor microline is 10 nm or less in longitudinal length and lateral length.

The semiconductor device may be arranged so that the semiconductor microline comprises at least silicon.

The Group IV semiconductor layer may comprise at least silicon.

The present invention also provides a semiconductor device which includes a p-type Group IV semiconductor layer, a multilayer semiconductor structure on the p-type Group IV semiconductor layer, and an n-type Group IV semiconductor layer formed on the multilayer semiconductor structure. The structure includes an alternate lamination of Group IV semiconductor layers, each being 10 nm thick or less, and high-resistivity or insulative films, each being less than or equal to 5 nm in thickness and greater in resistivity than the semiconductor. The structure has a total thickness of the laminated Group IV semiconductor layers equal to 80 nm or less. Upon application of a voltage between the p-type Group IV semiconductor layer and the n-type Group IV semiconductor layer, electrons and holes tunnel through the insulative film for injection into the Group IV semiconductor layer so that the electrons and holes are recombined together for emitting light.

The present invention also provides a semiconductor device including a p- or n-type Group IV semiconductor layer, a multilayer semiconductor structure on the Group IV semiconductor layer, and a metal layer formed on the multilayer semiconductor structure. The structure includes an alternate lamination of Group IV semiconductor layers, each 10 nm thick or less, and high-resistive or insulative films, each 5 nm thick or less and being greater in resistivity than the semiconductor. The structure has a total thickness equal to 80 nm or less. Upon application of a voltage between the Group IV semiconductor layer and the metal layer, electrons and holes tunnel through the insulative film into the semiconductor layers for recombination leading to emission of light.

The present invention also provides a semiconductor device which includes a light receiving element made of Group IV semiconductor and any one of the prescribed semiconductor devices as provided on the same semiconductor substrate.

The present invention also provides a semiconductor device including an integrated circuit having transistors made of Group IV semiconductor, resistors, and capacitors, a light receiving element made of Group IV semiconductor, and any one of the semiconductor devices stated above as provided on the same semiconductor substrate.

BRIEF DESCRIPTION OF THE DRAWINGS

FIG. 11 shows a plan view of the semiconductor device of FIG. 10.

DETAILED DESCRIPTION OF THE PREFERRED EMBODIMENTS

The present invention is featured in that a light emittable layer is structured including a thin dielectric film (or high-resistivity film) which surrounds or "wraps" Group IV semiconductor microcrystals consisting essentially of those crystals of 10 nm or less in size with an ability to exhibit the quantum size effect (the effect of permitting quantum confinement increases as the size decreases). Another feature of the present invention lies in a structure having Group IV semiconductor microcrystals buried in either a dielectric layer or a high-resistivity layer. Still another feature of the present invention is that this light emitting layer is disposed between p- and n-type semiconductors for allowing, upon application of a voltage therebetween, holes and electrons to penetrate the thin dielectric film by tunnel effect for injection into the semiconductor microcrystals, thereby causing emission of light by recombination. This may render a luminous efficacy that is increased beyond that of prior art light emitting devices.

Also, in accordance with the present invention, the light emission layer may reside between a metal film and a p-type semiconductor, or alternatively between a metal film and an n-type semiconductor.

Further, according to the present invention, the light emission layer is structured so that a thin dielectric film (oxide film or nitride film) surrounds the Si microcrystals, typically 10 nm or less in size, which allows enhancement of the quantum confinement effect thus enabling this part to be transformed into pseudo direct transition-type semiconductor so that the luminous efficacy increases.

Furthermore, use of the structure with the light emission layer disposed between the p- and n-type semiconductors, the structure with the emission layer between the metal and p-type semiconductor, or the structure with the layer between the metal and n-type semiconductor allows holes and electrons to be efficiently injected into the semiconductor microcrystals upon power-up of the device thereby enabling the intended recombination to take place only at the microstructure section, which in turn enables the luminous efficacy to increase. Simultaneously, it is possible to electrically control the emission of light.

The present invention is also capable of causing the light emission wavelength to vary or change depending on the size of semiconductor microcrystals. This makes it possible to control the wavelength of emitted light by appropriate adjustment of the size of such microcrystals.

A further advantage is that strong light emission is achievable at low voltage potentials. This can be said because any extra voltages are no longer required because the microcrystal layer having its solid part with filling density of 95% or greater (substantially 100%) remains low in resistivity as compared to porous silicon, which is high in resistivity due to inclusion of pores therein.

Figure 13:
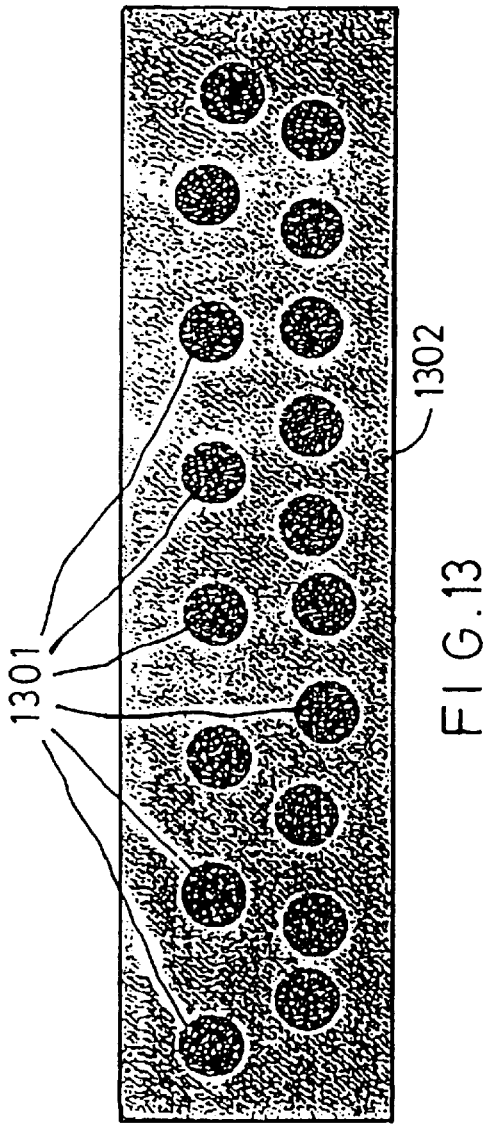
FIG. 13 is a cross-sectional pictorial representation of a sectional structure of a light emission layer including a plurality of microcrystals embodying the present invention.

FIG. 13 is a cross-sectional view of a typical form of the light emittable device implementing the principles of the present invention. As shown, the structure has semiconductor microcrystals 1301 buried in a high-resistivity or dielectric layer 1302.

Figure 14:
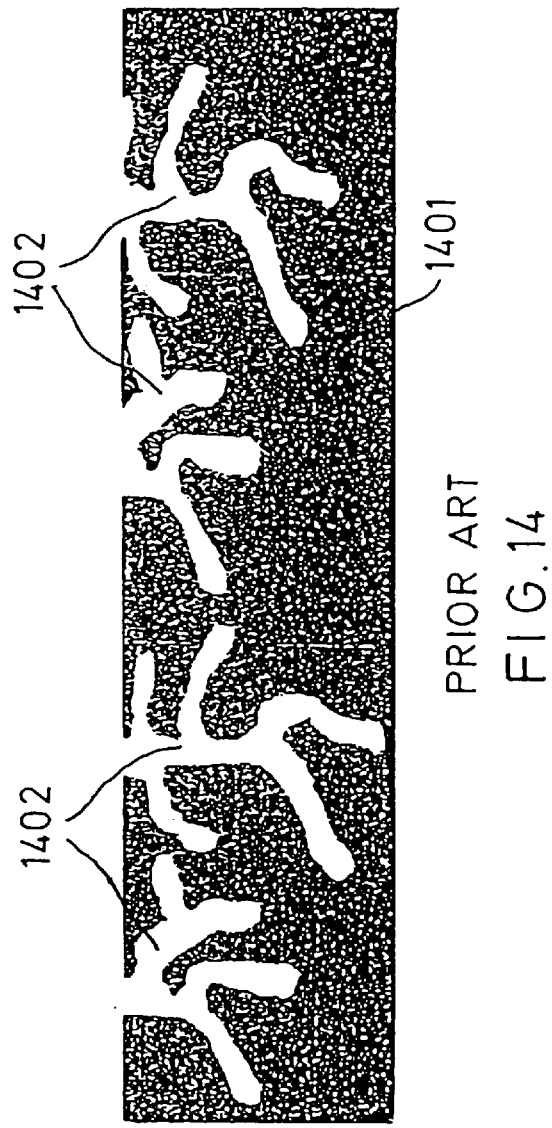
FIG. 14 is a cross-sectional view of prior art porous silicon.

FIG. 14 is a cross-sectional view of prior art porous silicon. The porous silicon shown in FIG. 14 is structured such that a semiconductor layer 1401 is etched resulting in the formation of an increased number of pores 1402 therein.

A still further advantage of the present invention lies in an ability to fabricate a monolithic silicon functional device originated from integrally forming the prescribed semiconductor light emitting device along with other silicon-based semiconductor device components including, but not limited to, memories and CPU on the same silicon substrate.

Several preferred embodiments of the invention will be described in detail with reference to the accompanying drawings. Note however that the invention should not exclusively be limited the illustrative embodiments, and may also be reduced to practice in a variety of forms of modifications.

First Embodiment

Figure 1:
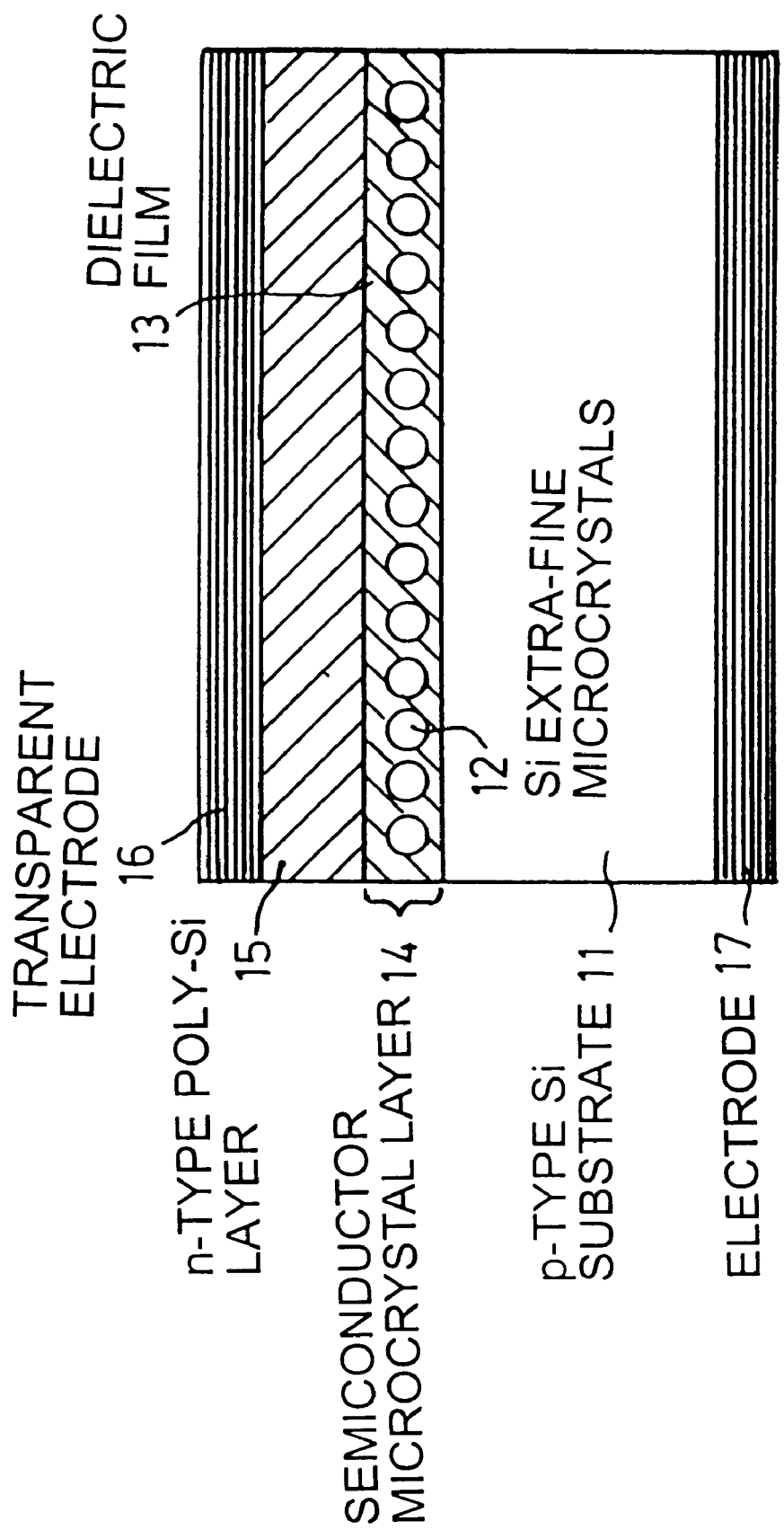
FIGS. 1 through 4 are cross-sectional diagrams illustrating semiconductor devices in accordance with respective first through fourth embodiments of the present invention.

Referring now to FIG. 1, there is shown a cross-sectional view of a light emitting electro-luminescence semiconductor device in accordance with a first embodiment of the present invention.

As shown, a p-type silicon (Si) substrate 11 has a top surface on which a semiconductor microcrystal layer 14 is formed. The semiconductor microcrystal layer 14 includes a dielectric film 13 and Si extra-fine microcrystals 12 "buried" in the dielectric film 13. The dielectric film 13 may be formed of, for example, $SiO_2$. An n-type polycrystalline silicon (poly-Si) layer 15 is formed on the semiconductor microcrystal layer 14. A transparent electrode 16 is formed on the n-type poly-Si layer 15. An electrode 17 is formed on the bottom surface of the p-type Si substrate 11 thus completing the structure of the semiconductor device embodying a first embodiment of the present invention.

A manufacturing method of the semiconductor device shown in FIG. 1 is now explained.

Firstly, a thermal oxide film is formed by oxidation techniques on the surface of the p-type Si substrate 11 to a predetermined thickness of, for example, 1 nanometer (nm). The oxidation used may be thermal oxidation of the substrate in an oxygen gas—preferably, dry oxidation. Then, the resulting structure is subjected to chemical vapor deposition (CVD) process using disilane as a raw-material gas at a pressure of, for example, 1 Torr, permitting the Si microcrystals 12 to grow on the oxide film at a temperature of 700° C. for two minutes. The resultant Si microcrystals 12 are about 5 nm in grain diameter or size. Next, the structure is again oxidized in an oxygen gas at a temperature of 750° C. for 1-nm oxidation of the part of the structure around the microcrystals 12. In this way the semiconductor microcrystal layer 14 is fabricated to have the $SiO_2$ film 13 on the surface of the layer 14.

Next, both Si and lesser amounts of arsenide (As) dopants are simultaneously deposited on the semiconductor microcrystal layer 14 while the substrate 11 is set at a temperature of 550° C. to thereby grow the n-type poly-Si layer 15 to a thickness of, for example, several hundreds of nanometers. The thickness of this n-type poly-Si is carefully determined to ensure that the luminous efficacy is insignificantly attenuated.

Further, a transparent electrode 16 is formed by vapor deposition on the n-type poly-Si layer 15 overlying the substrate 11. For example, the electrode 16 may be made of indium tin oxide (ITO). A metal electrode 17 is vapor-deposited on the bottom surface of the substrate 11 thus completing a pin-junction diode structure.

Upon application of a forward biasing voltage to the pin diode thus fabricated, electrons and holes "tunnel" through the dielectric film 13 to be injected into the Si microcrystals 12 buried in the dielectric film 13, resulting in recombination of holes and electrons in this part. In the case of this structure the wavelength of light emitted covers regions of the spectrum that range from infrared to red light.

Alternatively, even upon applying of a reverse bias voltage to the pin diode, as long as the biasing is sufficiently greater in potential, electrons and carriers tend to have high electrostatic potential energy for tunneling through the oxide film from the p-type layer and the n-type layer in a manner converse to that in the case of forward biasing. For this reason it has been found that the application of reverse bias voltages also permits injection of electrons and holes into the Si microcrystals 12 for their recombination and resultant emission of light.

In the illustrative embodiment, the efficiency of electron/hole injection is slightly reduced because the energy gap of the Si microcrystals 12 is greater than the band gap of the p-type silicon substrate 11 and the n-type poly-silicon layer 15. To improve this, a structure may be formed with the p- and n-type silicon layer replaced with p- and n-type silicon carbide (SiC) crystalline (or amorphous) layers. This replacement can be made because SiC is greater in band gap than Si thus enabling efficient injection of electrons and holes. This effectivity may be applicable in common to some other embodiments later described. In addition, similar effects and advantages are expected for device structures fabricated employing those microcrystals other than the Si per se, including Ge, SiC, SiGe, Group III-V or II-VI element chemical compound semiconductors. Such microcrystals are manufacturable using currently available CVD techniques.

It is noted that the pin-junction light emission diode embodying the present invention is capable of readily providing outward emission of light rays from the sidewalls of the device. Such outward emission is further increased in efficiency by making the layer overlying the light emission layer 14 thinner (e.g., the n-type poly-silicon layer 15, in the illustrative embodiment) or alternatively by employing chosen materials with the optical absorption edge shorter than the wavelength of light rays emitted. Note also that as in the embodiment, the Si microcrystals 12 are formed by CVD growth techniques and then are subject to thermal processing for oxidation of the surface thereof using dry thermal oxidation techniques, thereby to provide the semiconductor microcrystalline layer 14 with increased density.

Second Embodiment

Figure 2:
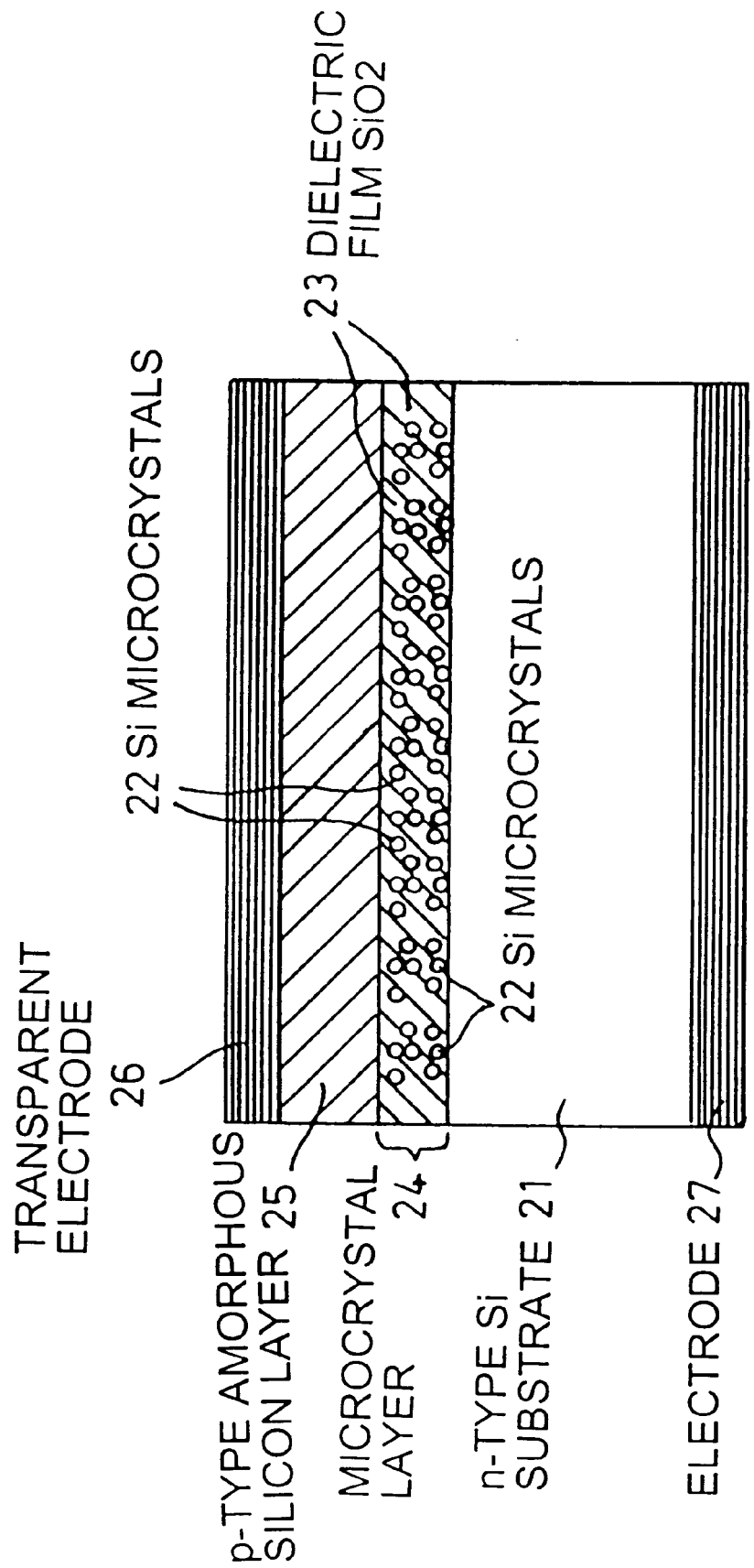

FIG. 2 is a cross-sectional view of a light emitting diode (LED) structure in accordance with a second embodiment of the present invention.

As shown in FIG. 2, an n-type Si substrate 21 has on a top surface a semiconductor microcrystalline layer 24, which includes a dielectric film 23 and a plurality of Si microcrystals 22 buried in the dielectric film 23. The dielectric film 23 may be made of $SiO_2$, for example. The microcrystal layer 24 has a surface on which a p-type amorphous silicon layer 25 is formed. A transparent electrode 26 is formed on the amorphous silicon layer 25. An electrode 27 is formed on the bottom surface of the n-type Si substrate 21, thus completing the semiconductor LED structure embodying the second embodiment of the present invention.

A manufacturing method of the device of FIG. 2 is as follows.

First, the n-type Si substrate 21 is placed on a support table in a molecular beam epitaxy (MBE) apparatus used; then, amorphous silicon is grown to a thickness of 10 nm while the substrate 21 is maintained at room temperature. Thereafter, thermal processing is done in the oxygen-gas atmosphere at 500° C. for ten minutes, whereby the Si microcrystals 22 of grain size of several nanometers are formed within the silicon oxide film. The grain size of such Si microcrystals 22 are well controllable by adjustment of the heating time period.

Thus, the dielectric film 23 is formed surrounding or "wrapping" the Si microcrystals 22 to thereby form the semiconductor microcrystal layer 24.

Then, both Si and Boron (B) dopants are supplied simultaneously to the top surface of the semiconductor microcrystal layer 24 thereby permitting a p-type amorphous silicon layer 25 to grow thereon to a thickness of several hundreds of nanometers. When light rays are to be taken out of the surface of resultant device structure, suppressing the optical absorption at the amorphous silicon may increase the transmissivity. This is attainable by hydrogen termination of a dangling bond of silicon residing within the amorphous layer through thermal processing of the p-type amorphous silicon layer 25 in a hydrogen gas.

Next, the transparent electrode 26 and metal electrode 27 are formed in a way similar to that in the embodiment of FIG. 1, completing the intended structure of the LED also embodying the second embodiment of the present invention.

An operation of this LED is as follows. Upon application of a forward bias voltage thereto, holes and electrons injected from the electrodes tunnel through the thin $SiO_2$ film 23 for injection into the Si microcrystals 22 for recombination leading to emission of light. The wavelength of light emitted is determinable depending on the crystal size or dimension. One example is that visible red light is emittable from those Si microcrystals of 3-nm grain size. In this LED structure also, visible light emission is obtainable even upon application of a reverse bias voltage as in the embodiment of FIG. 1 stated supra.

Third Embodiment

Figure 3:
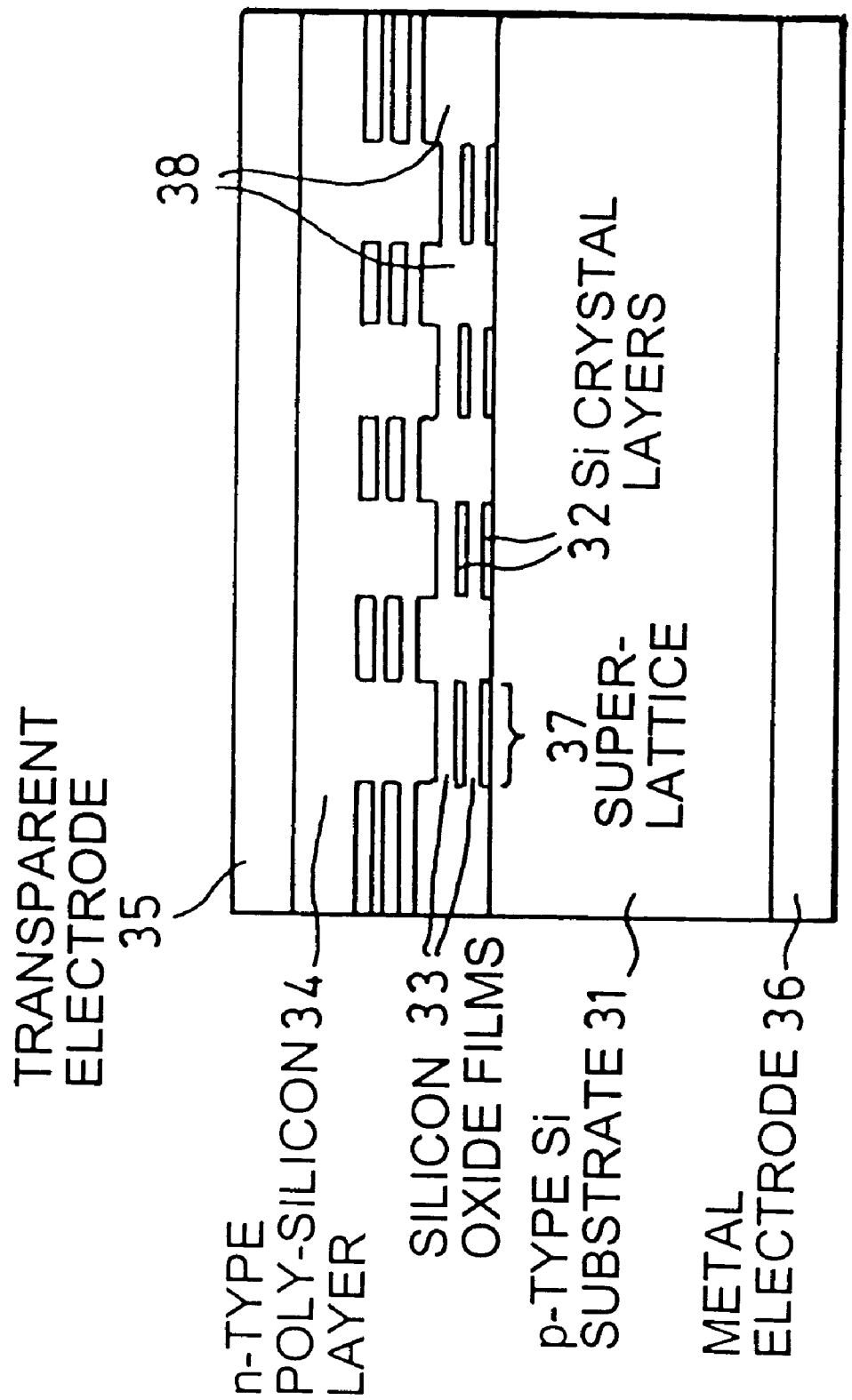

FIG. 3 is a cross-sectional view illustrating an LED device embodying a third embodiment of the present invention.

As shown, a p-type Si substrate 31 has on a surface a multilayer structure, which may be an alternate lamination of Si crystal layers 32 and silicon oxide films 33, and a dielectric layer 38 between the multilayer structures. The dielectric layer 38 may be formed of silicon dioxide, for example. An n-type poly-silicon layer 34 is formed overlying the multilayer structure. A transparent electrode 35 is formed on the layer 34. A metal electrode 36 is formed on the bottom surface of the p-type Si substrate 31, completing the LED structure implementing the principles of the present invention. With this embodiment, electrons and holes are injected into the poly-silicon layers 32 at part of a superlattice 37 for emission of light rays.

The LED structure of FIG. 3 is manufacturable using the procedure as described below.

First, a p-type amorphous silicon layer is formed by MBE techniques on the surface of the p-type Si substrate 31, to a thickness of a few of micrometers. Then, a thermal oxide am film, typically 10 nm thick, is formed by dry thermal oxidation techniques. The resulting structure is then irradiated with an electron beam having a 2-nm probe diameter, which is focused defining thereon a spot of a predefined size. Next, a chosen hydrofluosilicic acid-based etchant etches the structure for selective etching beam-irradiated portions. In this embodiment Si-exposed regions of 5-nm diameter (portions for use in forming the superlattices 37 shown in FIG. 3) are formed.

Then, amorphous Si of 3 nm thickness is grown using MBE techniques. Thereafter, a selected part of the Si which corresponds to its surface portion approximately 1 nm thick is thermally oxidized by dry oxidation techniques in an oxygen gas at 750° C., thus forming an oxide film 33 to a thickness of 2 nm (the resultant thickness is substantially doubled due to volumetric expansion). Next, an amorphous Si layer 32 is grown thereon to a thickness of 3 nm, which is then dry-oxidized for formation of a Si oxide film typically 2 nm thick. This structure is then heated under vacuum at about 1000° C. for several tens of minutes, which results in recrystallization of the amorphous Si forming the superlattice structures 37 shown in FIG. 3.

Next, the resultant structure is subject to MBE process at low temperatures while at the same time supplying molecular beams of As and Si as dopants onto the substrate surface so that an n-type poly-silicon film 34 is grown thereon to a thickness of several hundreds of nanometers. A transparent electrode 35 of ITO is vapor-deposited on the n-type poly-Si film 34, while a metal electrode 36 is vapor-deposited on the bottom of the p-type Si substrate 31.

An operation of the pin-junction diode thus fabricated is as follows. Upon applying a forward bias thereto, holes and electrons injected pass through, by tunnel effect, the silicon oxide film 33 of 2 nm thickness into the superlattice 37, and then recombine together at the silicon crystal layers 32 within the superlattice 37 thereby causing emission of light rays. The peak wavelength of light emitted in this case is about 520 nm (in the range of green light). In the LED structure shown in FIG. 3, light emission is attainable even upon application of a reverse bias voltage as in the embodiment of FIG. 1.

In the case of the lamination structure of multiple films as in the FIG. 3 embodiment, the appropriate total film thickness of the microcrystal layers acting as the light emission layer is determined, for example, by calculating the voltage dependency of the light emission and light intensity characteristics of the layers.

Figure 15:
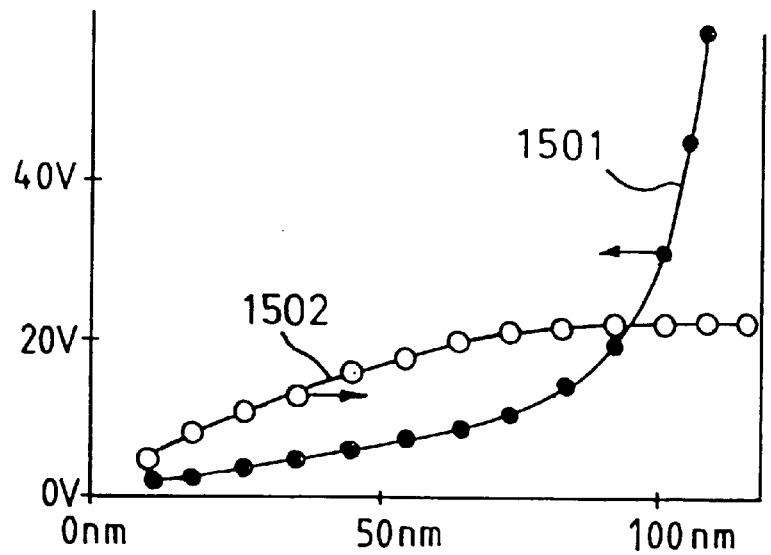
FIG. 15 is a graph showing a relation of a turn-on voltage and light intensity versus a total film thickness in a semiconductor device embodying the present invention.

FIG. 15 is a graph showing, based on calculation values, a relation of a voltage necessary for light emission (turn-on voltage) versus the light emission layer's total thickness along with a relation of emitted light intensity and the total thickness. As shown, the turn-on voltage shown by a line 1501 tends to rapidly increase at a point whereat the total thickness of the light emission layer goes beyond 80 nm. This is because a series resistance of the device increases in value with an increase in thickness. This is also because multiplication of electrons occurs owing to the avalanche break down in the case of thin layer. Conversely, the light intensity shown by a line 1502 becomes saturated when the thickness is about 80 nm. Thus, it is preferable that the total thickness is less than or equal to 80 nm.

The thickness reduction is also important in the manufacture of the microcrystals. If the thickness is significant then a temperature variation can occur during thermal processing for fabrication of microcrystals, which in turn renders variable the microcrystal size and density. In the Chen et al. article discussed previously in the Discussion of the Background, the total thickness of light emission layer is as large as 200 nm. For the very reason it is difficult to achieve the intended crystallization using standard thermal processing; in the alternative, the approach in the Chen et al. article is designed to achieve crystallization using laser radiation. The turn-on voltage is as high as 25 volts. This is due to variation of microcrystal size and density in addition to increase of the series resistance. With the structure embodying the present invention, the thickness is sufficiently reduced or minimized increasing the thermal conductivity, which in turn makes it possible to facilitate fabrication of uniform or regular microcrystals.

It should be noted that although in this embodiment the multilayer films are made of $SiO_2$, this material may be replaced with low-resistivity dielectric materials such as amorphous SiC or amorphous carbon (C). For such materials, the intended light emission is achievable with even lower voltages. Such materials may be fabricatable in the form of films with increased accuracy by use of presently available plasma CVD or thermal CVD techniques.

Fourth Embodiment

Figure 4:
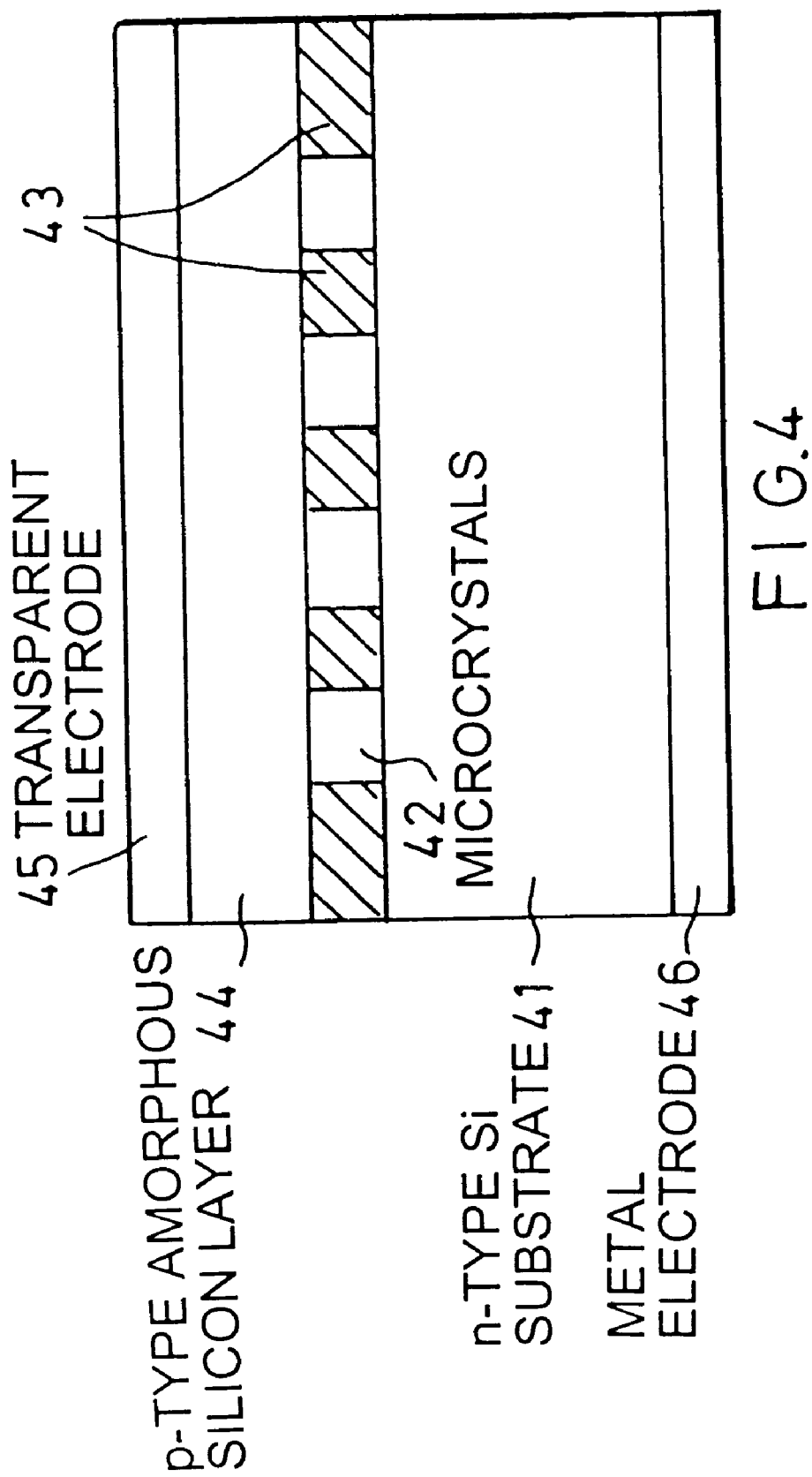

FIG. 4 is a cross-sectional view of a pin-junction LED in accordance with a fourth embodiment of the present invention.

An n-type Si substrate 41 has on a top surface an array of spaced-apart microcrystals 42 with surfaces each covered by a dielectric film. An interval space between adjacent ones of microcrystals 42 is filled with a dielectric layer 43, which may be, for example, $Si_3N_4$. A p-type amorphous silicon layer 44 is formed overlying the dielectric layers 43. A transparent electrode 45 is formed on the p-type amorphous silicon layer 44. A metal electrode 46 is formed on the bottom of the n-type Si substrate 41 thus completing the semiconductor device structure embodying the fourth embodiment of the present invention.

The LED structure of FIG. 4 may be manufactured by the method which follows.

First, a shaped electron beam is used to travel downward to hit the surface of the n-type Si substrate 41, causing residual carbon contamination to be deposited thereon by electron excitation reaction to a thickness of 1 nm and with a diameter of 10 nm. Then, a Si3N4 layer 43 is deposited on the substrate 41 by plasma CVD techniques to a thickness of 10 nm so that $Si_3N_4$ resides only on selected regions which do not overly the carbon contamination.

Then, only the carbon contamination part is removed by using oxygen plasma etching techniques. At this time the $Si_3N_4$ film 43 is also etched away slightly so that its thickness is reduced at 5 nm. Next, a layer is selectively formed to contain silicon microcrystals 42 on those sections without the $Si_3N_4$ film 43, in a way similar to that in the embodiments of FIG. 1 or FIG. 2.

Next, Si and boron (B) dopant impurities are applied to the silicon microcrystals 42 and the dielectric film 43, to grow the p-type amorphous silicon layer 44 to a thickness of several hundreds of nanometers. If light rays are to be taken out of the device surface, the p-type amorphous silicon layer 44 is heated in a hydrogen gas for hydrogen-termination of a dangling bond of silicon within the amorphous layer to thereby suppress optical absorption at amorphous silicon thus increasing the transmissivity.

Next, as in the FIG. 1 embodiment, the transparent ITO electrode 45 is formed on the p-type amorphous silicon layer 44, and the metal electrode 46 is formed on the bottom of the n-type silicon substrate 41, completing the illustrative LED structure.

Fifth Embodiment

Figure 5:
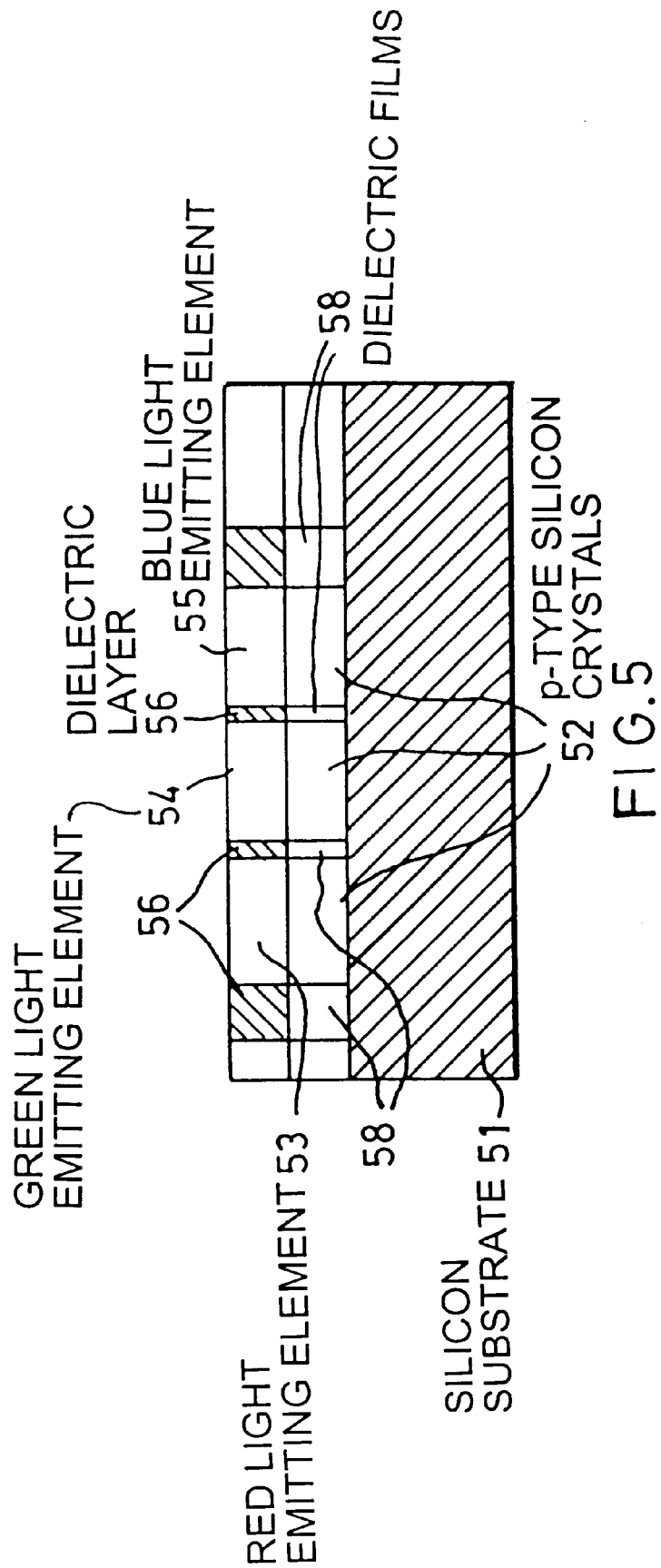
FIG. 5 illustrates, in cross-sectional view, a semiconductor display panel in accordance with a fifth embodiment of the present invention.

FIG. 5 is a cross-sectional view of a flat-surface display panel in accordance with a fifth embodiment of the present invention. The flat-surface display panel includes a matrix array of rows and columns of picture elements or "pixels" each employing the pin-junction LED of FIG. 1.

As shown in FIG. 5, the display panel has a silicon substrate 51 on which a plurality of p-type silicon crystals 52 are formed so that adjacent ones of the crystals 52 are electrically insulated from each other by dielectric films 58. Integrated circuitry (not shown) is also formed on the substrate 51, and includes transistors for controlling voltages applied to a respective one of the p-type silicon crystals 52. A red light emitting element 53, a green light emitting element 54, and a blue light emitting element 55 are provided for each pixel on corresponding ones of the p-type silicon crystals 52. Adjacent ones of the elements 53, 54, and 55 are isolated from each other by a dielectric layer 56. A common electrode (not shown) made of ITO is formed overlying the light emission elements 53–55.

Figure 6:
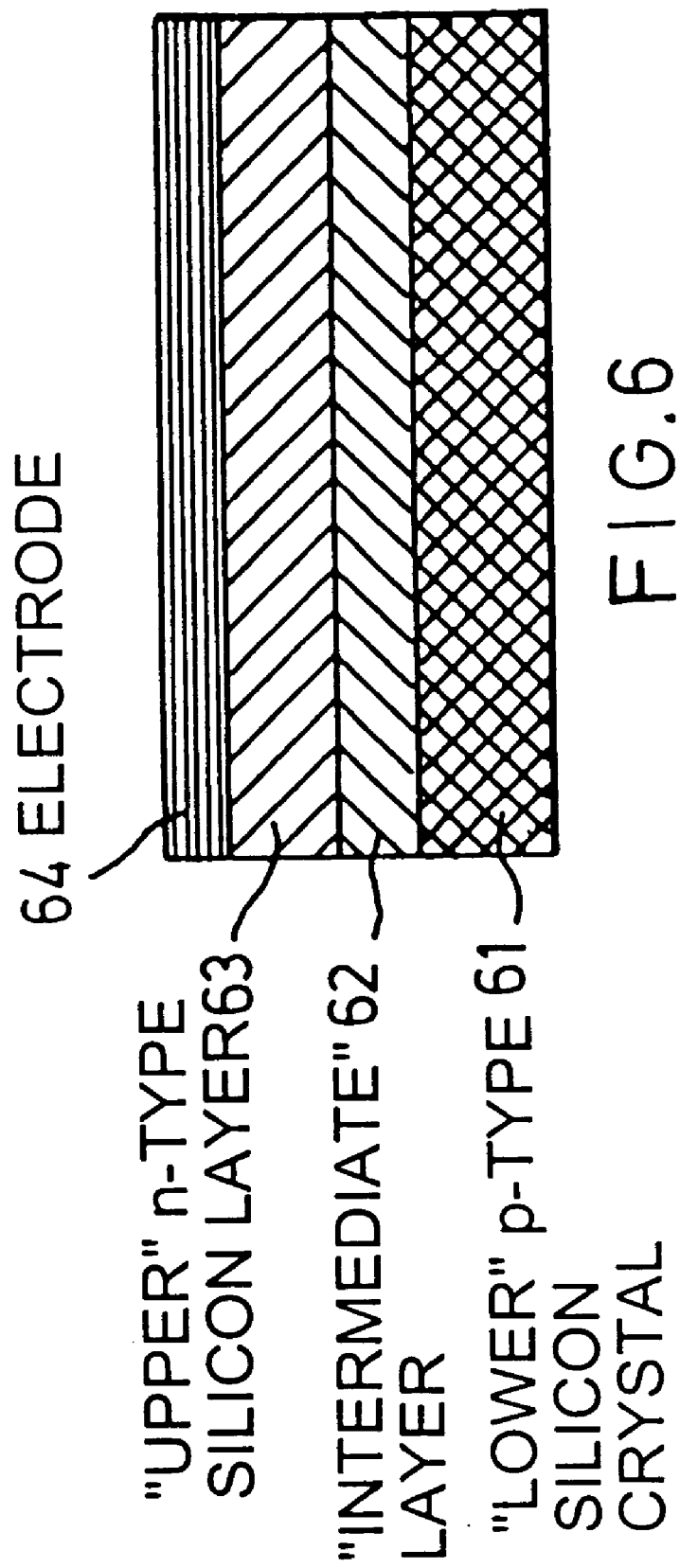
FIG. 6 depicts an enlarged sectional view of a light emission element of the display panel shown in FIG. 5.

FIG. 6 is an enlarged cross-sectional view of the light emission elements 53–55. Each of the light emission elements 53–55 has a multilayer structure that comprises a "lower" p-type silicon crystal 61, an "intermediate" layer 62, and an "upper" n-type silicon layer 63. The intermediate layer 62 contains therein silicon microcrystals as in the embodiments of FIGS. 1 and 2, and thus acts as a light emission layer. The electrode 64 has on a surface a common electrode 64 coupled to ground. The upper layer 63 may be made of ITO, for example.

The flat display panel may be manufactured by the procedure which follows.

First, an integrated circuit (IC) of transistors is formed on the silicon substrate 51 using silicon-process technologies such as lithography and etching techniques. This IC is for use in controlling voltages applied to a matrix of light emission elements as described in detail later. Then, a p-type silicon crystal layer is deposited by CVD techniques. Next, the resulting structure is etched through photolithography process to form the p-type silicon crystals 52, each crystal 52 having a square planar shape of 100 μm×100 μm dimensions. The crystals 52 of each element are isolated from the other elements by the silicon oxide film 53.

A silicon oxide film is then grown by CVD techniques on this substrate to a thickness of 1 μm. The film becomes a dielectric film. The resultant structure is patterned by photoexposure methods and then etched to expose selected p-type silicon crystals to the outside. The crystals are for later formation of the red light emitting elements 53. After formation of an oxide film approximately 2 nm thick by thermal oxidation, silicon crystals of 5-nm diameter are grown by CVD techniques. The crystals are then thermally oxidized forming a light emission layer 62, which is coated with a thin thermal oxide film and contains therein silicon microcrystals of 3-nm diameter. At this time the microcrystals are "saturated" in dimension due to the strain between the oxide film and silicon, and thus vary insignificantly in size during continuous execution of oxidation process for a predefined time period. The resulting microcrystals may exhibit electroluminescence of red light rays.

Next, those portions of the oxide film overlying other selected regions in which the green light emitting elements are to be formed are patterned by photolithography techniques and etched for removal. After thermal oxidation is done forming an oxide film of 2-nm thickness, silicon microcrystals of 4-nm diameter are then grown by CVD techniques. The resultant structure is then thermally oxidized forming a light emission layer 62 containing 2-nm diameter silicon microcrystals. During this thermal oxidation process, the previously fabricated 3-nm diameter microcrystals are kept unchanged, because they exhibit no further progression of reaction due to presence of the strain between the oxide film and silicon. The microcrystals thus formed cause electroluminescence of green light rays due to the quantum size effect.

Next, those portions of the oxide film overlying the remaining selected regions in which the blue light emission elements are to be formed are patterned by photoexposure techniques and etched for removal. After formation by thermal oxidation of an oxide film approximately 2 nm thick, silicon microcrystals of 3-nm diameter are grown by CVD techniques. The resultant structure is then thermally oxidized forming a light emission layer 62 containing 1.5-nm diameter silicon microcrystals. The microcrystals thus formed may exhibit electroluminescence of blue light by the quantum size effect.

The formation regions of red (R), green (G) and blue (B) light emission elements 53–55 are such that these are disposed sequentially (stripe pattern layout); alternatively these elements may be in a triangular pattern (mosaic layout). In any case these are arranged with a group of three RGB elements per pixel.

Next, an n-type polysilicon layer is grown by CVD techniques on the light emission layers 62; thereafter, a transparent ITO electrode is deposited thereon. The ITO electrode is held at ground potential in common with respective elements. The resultant device structure is arranged to accompany a pre-fabricated IC unit used to render a current (or voltage) being supplied to the three (RGB) types of emission elements variable in thirty two (32) equal steps of levels in a digital fashion. With such an arrangement, one emission element offers ability to display 32 different tones of a single color; thus, combining three color light emitting elements enables displaying of an image with 32×32×32= 32,768 different color levels.

When these elements are formed on a 12-inch silicon substrate occupying a screen area of 20 cm×15 cm thereon, it becomes possible to achieve large-screen high-precision displayability with the total pixel number of 2000×1500. This display may also operate at increased speeds as compared to standard liquid crystal display (LCD) panels because the light emission elements are placed directly on the IC on the silicon substrate while reducing the panel thickness. This may result in achieving a thin large-screen high-precision flat-surface display device which does not require any extra space for installation unlike conventional CRT television sets.

Sixth Embodiment

Figure 7:
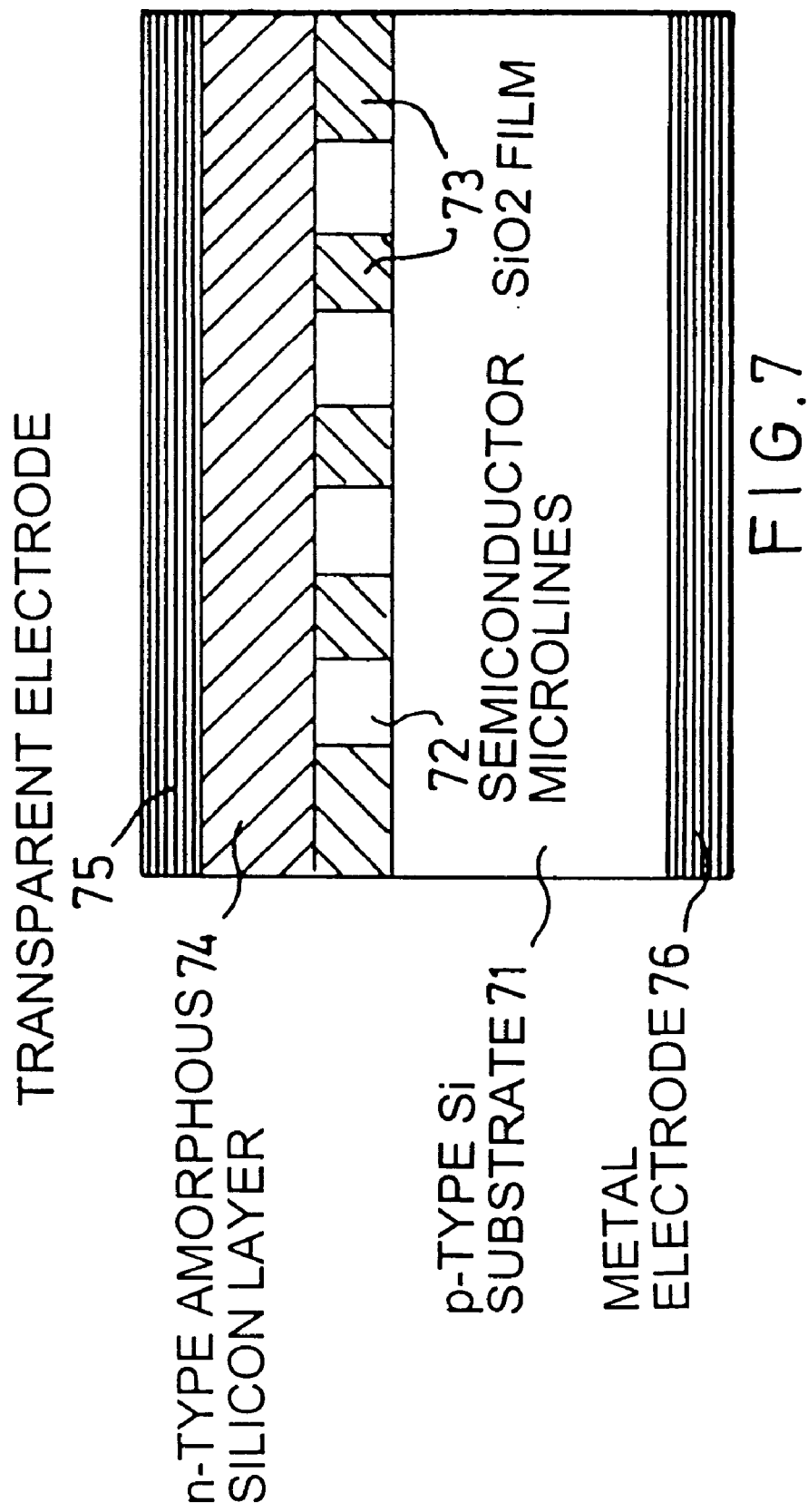
FIG. 7 shows a cross-sectional view of a semiconductor device in accordance with a sixth embodiment of the present invention.
Figure 8:
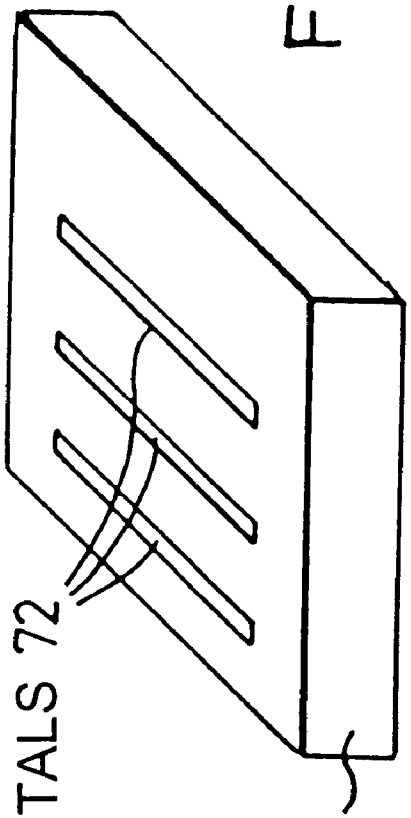
FIG. 8 is a perspective view of the semiconductor device shown in FIG. 7.

FIG. 7 is a cross-sectional view of a semiconductor device according to a sixth embodiment of the present invention. FIG. 8 is a corresponding perspective view of the semiconductor device of FIG. 7.

The semiconductor device comprises a p-type Si substrate 71. A plurality of parallel semiconductor fine-lines or microlines 72 are formed on the p-type Si substrate 71 with the surface of each line 72 being coated with a dielectric film. A dielectric film 73 is formed or "buried" between adjacent ones of the semiconductor microlines 72 on the substrate 71. The film 73 may be made of $SiO_2$, for example. An n-type amorphous silicon layer 74 is formed entirely overlying the microlines 72 and the $SiO_2$ film 73. A transparent electrode 75 is formed on the n-type amorphous silicon layer 74. A metal electrode 76 is formed on the bottom of the p-type Si substrate 71, thus completing the semiconductor device structure embodying the sixth embodiment of the present invention.

The device structure shown in FIGS. 7–8 is manufacturable by the procedure as follows.

A p-type silicon substrate 71 is prepared. A thermal oxide film is formed by dry thermal oxidation on the substrate to a thickness of 1 nm. Then, the surface of the oxide film is selectively exposed in linear regions thereon, using electron beam lithography techniques. Then, the resultant structure is heated at a temperature of 750° C. in a vacuum chamber to remove or peel off those exposed portions only, which results in partial exposure of the silicon substrate 71 at stripe-shaped portions approximately 7 nm wide. Silicon is then grown thereon by MBE techniques to a thickness of 1 nm while the substrate 41 is kept at a temperature of 550° C. The resulting fine-line microcrystals are extremely less in height and width allowing the quantum size effect to take place.

Then, the substrate temperature is lowered down at room temperatures. Silicon and a small amount of arsenide (As) impurity are deposited thereon simultaneously, letting the n-type amorphous silicon 74 grow to a thickness of several hundreds of nanometers in such a way that light rays emitted are obtainable while eliminating attenuation of the intensity thereof. A transparent ITO electrode 75 is formed by vapor deposition on the top surface of the n-type amorphous silicon 74, while a metal electrode 76 is formed by evaporation on the bottom of the substrate 71.

An operation of the pin-junction LED structure thus fabricated is as follows. Upon application of a forward bias voltage, holes and electrons are injected into the silicon microcrystals 72 for recombination thus emitting rays of light.

In this embodiment the wavelength of light emitted is spread over a spectrum having a peak at or near the periphery of a red light region of the spectrum.

Seventh Embodiment

Figure 9:
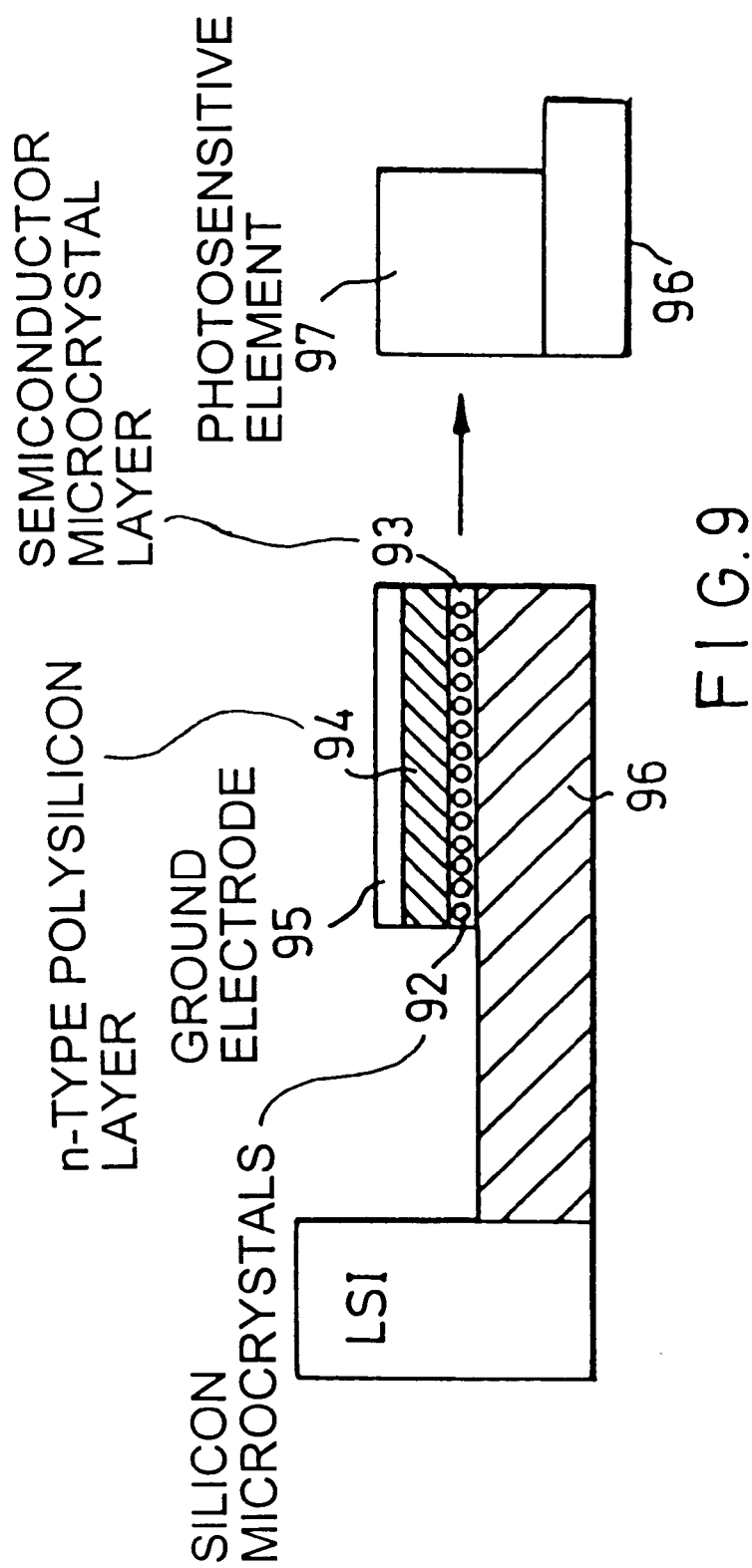
FIG. 9 depicts a cross-sectional view of a semiconductor device in accordance with a seventh embodiment of the present invention.

FIG. 9 is a cross-sectional view of a semiconductor light emittable device in accordance with a seventh embodiment of the present invention.

A p-type Si substrate 91 has a top surface on which a semiconductor microcrystal layer 93 is formed along with standard large-scale integrated (LSI) circuitry. The microcrystal layer 93 contains silicon microcrystals 92 with surfaces coated with a dielectric film. Formed on this semiconductor microcrystal layer 93 is an n-type polysilicon layer 94, on which a ground electrode 95 is formed and coupled to ground potential, thereby providing the semiconductor device with the LSI unit and light emitting element integrally fabricated. thereon. As shown in FIG. 9, an associative spaced-apart "external" circuit board with a photosensitive element 97 is disposed opposing the semiconductor device, the element 97 functioning as a light receiving element for receiving rays of light emitted from the semiconductor device.

In the FIG. 9 embodiment the device structure shown is adaptable for use as a light emitting device with any one of the light emitting elements shown in FIGS. 1–8 formed at the periphery of the LSI. This semiconductor device is designed so that an output voltage of the LSI is passed to the light emitting element rendering its signal controllable by the turn-on/off of light emission. The opposite photosensitive element 97 receives such turn-on/off signal from the light emitting element for conversion into a corresponding electrical signal, which is then forwarded to the circuitry on the board 96. With such an arrangement, electrical signals of the LSI may be optically transmittable thereby eliminating problems faced with prior art substrate-to-substrate electrical signal transmission schemes using metal leads, such as online signal delay and unwanted heat generation.

Although in this embodiment the light emitting and receiving elements are provided separately, both of them may alternatively be formed on a single silicon substrate. Since the light receiving element may be one of standard pn-junction silicon photodiodes, the element is manufacturable on the silicon substrate.

In addition, a single silicon substrate may be designed to have a surface that is divided into subareas, wherein one subarea of which is reserved for formation of power device components requiring highly rated voltage breakdown and the other of which is for low-voltage driven digital elements. The subareas may be spatially isolated from each other while permitting signal transmission between them using a combination of the light emitting and receiving elements described above. If this is the case, it becomes possible to further miniaturize or "downsize" the device as compared to prior art devices employing separate substrates, one for power elements and the other for digital elements.

The foregoing embodiments shown in FIGS. 1 through 9 are drawn to light emitting devices of the multilayer type wherein a current flows in a direction perpendicular to the substrate surface. An explanation is next given of light emitting devices of the "planar" type letting a current flow laterally relative to the substrate surface, which also incorporate the principles of the present invention. The device structures presented below are fabricatable even where the substrate is a dielectric substrate, and therefore are preferable in particular in the case these are operatively coupled to high-voltage device components.

Eighth Embodiment

Figure 10:
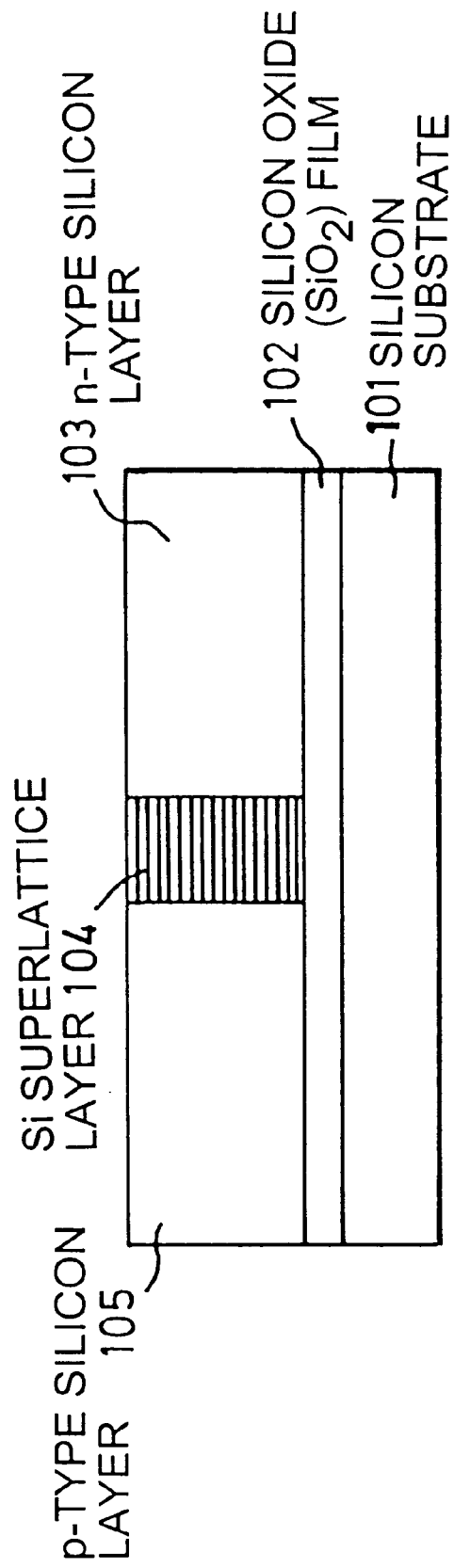
FIG. 10 shows a cross-sectional view of a semiconductor device in accordance with an eighth embodiment of the present invention.

FIG. 10 is a cross-sectional view of a semiconductor device implementing a "planar structure" in accordance with an eighth embodiment of the present invention. FIG. 11 is a plan view of the semiconductor device of FIG. 10.

A silicon substrate 101 has a surface on which a silicon oxide ($SiO_2$) film 102 is formed. An n-type silicon layer 103, and superlattice layer 104, and a p-type silicon layer 105 are formed on the $SiO_2$ film 102 in a side-by-side manner. The superlattice layer 104 may be a multilayer lamination of silicon films and $SiO_2$ films as shown in FIG. 10.

The device structure of FIGS. 10–11 may be fabricated by the method as described below.

First, the silicon substrate 101 is thermally oxidized to form a silicon oxide ($SiO_2$) film approximately 1 $\mu$m thick. A non-doped amorphous silicon layer is formed on the resulting surface by MBE techniques to a thickness of several nanometers at room temperatures. Then, the structure is placed in an oxygen gas environment for formation of a thermal oxide film, typically 1 nm thick, by dry thermal oxidation at a temperature of 750° C. An amorphous silicon film is formed on the resultant surface to be typically 3 nm thick using MBE growth techniques. Thereafter, a surface portion of 1 nm thickness of the silicon is oxidized by dry oxidation techniques at 750° C. thereby forming an oxide film having a thickness of 2 nm (the thickness will practically be doubled due to volume or bulk expansion). The amorphous silicon is further grown thereon to a thickness of 3 nm; then, using dry oxidation, a silicon oxide film approximately 2 nm thick is formed. This process is recurrently done twenty times thus fabricating a silicon/silicon-oxide superlattice structure. In this case the process is designed so that a silicon oxide film is on the top surface of such superlattice. Next, the structure is heated to about 1000° C. in a nitrogen gas for several tens of minutes, causing the amorphous silicon to partly exhibit recrystallization forming microcrystals therein so that the luminous efficacy increases.

Next, a patterned resist mask is formed with 1-$\mu$m line width by patterning process using stepper exposure techniques. The mask is used to perform reactive ion etching (RIE) process for removing the outer side portions of the superlattice. Then, a plasma CVD process is performed to selectively grow p-type silicon to a thickness of about 80 nm on the exposed areas resulting from the etching removal. Next, only one side of the superlattice's outer regions is doped by field ion implantation with a chosen impurity for change or "inversion" to the n-type conductivity. Electrodes are formed on the surface of the p-type and n-type regions. Experimentation has revealed that upon power-up, the resulting structure exhibits emission of infrared rays of light. This occurs because electron/hole confinement increases in effect within the superlattice. This structure is advantageous in that the resistivity decreases, unlike those structures of the vertical current-flow type.

Optionally, during fabrication of the superlattice, the structure with the amorphous silicon deposited may be heated at about 800° C. in oxygen gasses for formation of silicon microcrystals coated with an oxide film. Repeating this process results in the fabrication of a multilayer structure of insulated microcrystals. Low resistivity is obtainable by narrowing the superlattice so that it is less than 1 $\mu$m in width. To do this, the stepper exposure process is replaced with an electron-beam exposure process. Additionally, the reason for using the multilayer structure for the microcrystals is to lower the resistivity. When such low resistivity is not critical, the multilayered microcrystals are not necessarily employed and may be replaced with a mere single-layer structure for achieving sufficient light emitting performance.

Note also that while in this embodiment the multilayer dielectric films are made of $SiO_2$, these may alternatively be low-resistivity amorphous SiC or amorphous carbon (C). In such case, efficient light emission is achievable with lower voltages.

Ninth Embodiment

Figure 12:
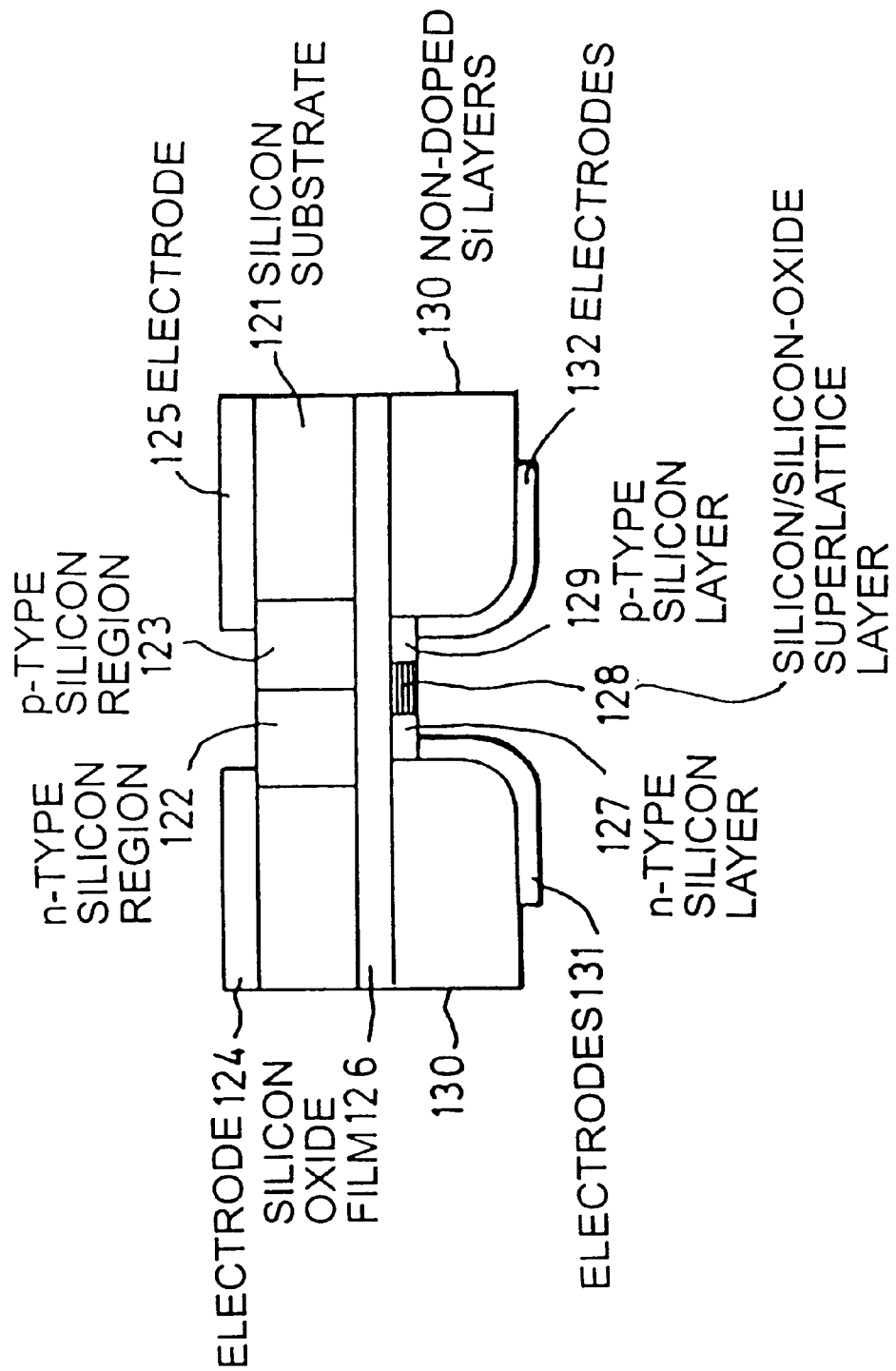
FIG. 12 is a cross-sectional view of a semiconductor device in accordance with a ninth embodiment of the present invention.

FIG. 12 is a cross-sectional view of a semiconductor photo-coupler device in accordance with a ninth embodiment of the present invention.

As shown, a silicon substrate 121 includes therein an n-type silicon region 122 and p-type silicon region 123 in a side-by-side manner. The substrate 121 has a surface on which electrodes 124, 125 are formed such that the electrode 124 has an end overlapping the n-type region 122, and the electrode 125 has an end overlapping the p-type region 123. The illustrative structure is adapted for use as a pn-junction photodiode that serves as a photosensitive or light receiving element. A bottom surface of the substrate 121—is coated with a silicon oxide film 126. An n-type silicon layer 127, a silicon/silicon-oxide superlattice layer 128, and a p-type silicon layer 129 are formed in a planar fashion on a bottom surface of the film 126. Non-doped Si layers 130 greater in thickness than the layers 127–129 are on the opposite sides of such planar structure on the substrate bottom surface as shown in FIG. 12. Electrodes 131, 132 are on the opposite Si layers 130 so that the electrode 131 is electrically connected to the n-type layer 127, and the electrode 132 is electrically connected to the p-type layer 129, thus completing the intended light emission device.

The device structure of FIG. 12 may be manufactured by the following procedure.

First, a substrate of the silicon on insulator (SOI) structure is formed with silicon and dielectric substrates laminated and bonded together. The SOI substrate may alternatively be of the SIMOX (separation by implantation of oxygen) structure. Using the SOI substrate, a standard pn-junction photodiode of known structures is fabricated on a silicon substrate 121. The bottom surface of the silicon substrate 121 is etched to define an opening at a location immediately underlying the transistor. A light emitting element is fabricated in a manner similar to that of the embodiment shown in FIGS. 10–11. Then, respective electrodes are formed on the top and bottom surfaces of the resultant structure using standard fabrication techniques, thus completing a photocoupler with the silicon oxide film 126 sandwiched therein.

One typical prior art photocoupler is such that it includes a light emitting element using a compound semiconductor, such as gallium arsenide (GaAs), and a silicon pn-junction photodiode or a silicon npn phototransistor, which are fabricated independently of each other, along with respective electrodes on which the elements are mounted while a chosen dielectric material, such as transparent resin or the like, is disposed between the elements. The illustrative embodiment structure is superior than such prior art in that the manufacturing process used is simplified while downsizing the structure due to an increase in the breakdown voltage irrespective of a decrease in thickness of the silicon oxide film used. Another advantage of the embodiment is that the illustrative photocoupler is manufacturable on the SOI substrate together with other silicon IC components.

It is noted that although in a respective one of the aforesaid embodiments the semiconductor microcrystals and superlattice are structured to reside between the n-type and p-type semiconductors, the p-n combination may be replaced with a combination of a metal and either one of the p- and n-type semiconductors. With such an alteration also, similar effects and advantages may be obtainable as demonstrated in an embodiment below.

Tenth Embodiment

Figure 16:
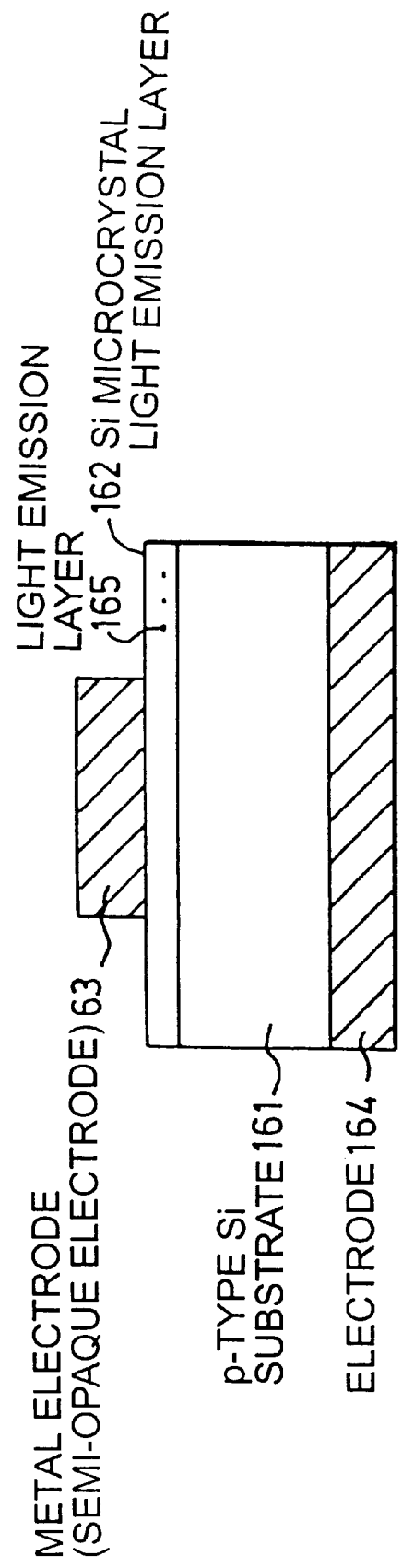
FIG. 16 depicts, in cross section, a semiconductor device in accordance with a tenth embodiment of the present invention.

FIG. 16 is a partial cross-sectional view of a semiconductor device of the metal insulator semiconductor (MIS) type in accordance with a tenth embodiment of the present invention.

A p-type Si substrate 161 has a surface on which a light emission layer 162 is formed. The light emission layer 162 may be made of amorphous silicon containing silicon microcrystals 165 "buried" distributionally therein. The Si microcrystal light emission layer 162 has on a surface a thin metal electrode (semi-opaque electrode) 163. The p-type Si substrate 161 has an electrode 164 on a bottom surface of the substrate 161, thus completing the device structure.

The structure is fabricated by the procedure below.

A p-type Si substrate 161 is prepared. Amorphous Si is deposited on the substrate 161 to a thickness of 3 nm, using MBE methods. Microcrystals 165 are formed in the amorphous Si at temperatures of 700 to 800° C. for one minute. The grain diameter of Si microcrystals may be, for example, about 2 nm. In this case the amorphous Si is higher in resistivity than Si.

Then, vapor deposition is performed to form a titanium film typically 5 nm thick and a gold film approximately 50 nm thick on the Si microcrystal layer 162, thus forming a metal electrode 163. Subsequently, a metal electrode 164 is vapor deposited on the bottom surface of the substrate 161, completing the MIS diode structure.

Figure 17:
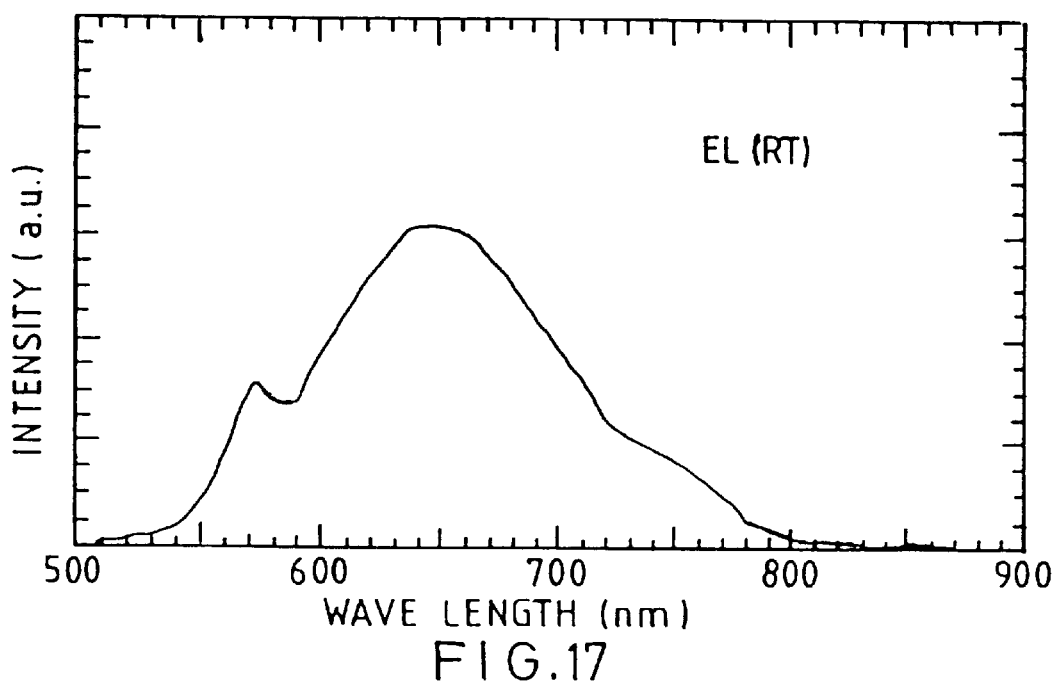
FIG. 17 is a graph showing a relation of wavelength versus intensity of light emitted in the semiconductor device shown in FIG. 16.

It has been experimentally confirmed that upon applying a potentially sufficient reverse bias voltage to the MIS diode, electrons and holes have higher electrostatic potential energies, which results in the electrons and holes being injected through the amorphous Si from the p-type layer 161 and the metal electrode 163 respectively, in a way contrary to that in the case of forward biasing, to thereby exhibit emission of light rays. While the microcrystal layer 165 acting as the light emission layer is as thin as 3 nm, the intensity of light emitted was significant enough to ensure that sufficient visibility remains at room temperatures upon application of a voltage of 4 to 5 volts. The light emitted is colored in orange. The spectrum of the emitted light is shown in FIG. 17.

It has been described that the present invention offers the capability to efficiently inject by tunnel effect electrons and holes into the silicon region of a selected size that render an expected quantum effect, which in turn provides a semiconductor device with enhanced luminous efficacy. Another advantage of the present invention lies in the ability to fabricate a light emitting element using a silicon substrate, which results in an increase in performance and reliability and yet a decrease in dimension while simultaneously enhancing the matchability with other silicon-based semiconductor device components.

Although the invention has been disclosed and illustrated with reference to particular embodiments, the principles involved are susceptible for use in numerous other embodiments, modification and alterations which will be apparent to persons skilled in the art to which the invention pertains. The invention is, therefore, to be limited only as indicated by the score of the appended claims.

What is claimed is:

1. A semiconductor device comprising:
    a p-type Group IV semiconductor layer;
    a semiconductor microcrystalline layer formed on said p-type Group IV semiconductor layer and containing semiconductor microcrystals having a surface covered by a film having a resistivity greater than the resistivity of said semiconductor microcrystalline layer; and
    an n-type Group IV semiconductor layer formed on said semiconductor microcrystalline layer,
    said semiconductor microcrystalline layer having a size to exhibit a quantum confinement effect thereby permitting electrons and holes, upon application of a voltage between said p-type Group IV semiconductor layer and said n-type Group IV semiconductor layer, to tunnel through said film for injection into said semiconductor microcrystalline layer so that the electrons and holes are recombined together for emission of light.

2. The semiconductor device according to claim 1, wherein said semiconductor crystal comprises silicon.

3. The semiconductor device according to claim 1, wherein one of said p-type Group IV semiconductor and said n-type Group IV semiconductor comprises silicon.

4. The semiconductor device according to claim 1, wherein said semiconductor microcrystalline layer comprises holes in a volume equal to or less than five percent of a volume of the microcrystalline layer.

5. The semiconductor device according to claim 1, wherein a thickness of said microcrystalline layer is less than or equal to 80 nanometers.

6. A semiconductor device comprising:
    a Group IV semiconductor layer having a conductive type of a first type;
    a semiconductor microcrystalline layer formed on said Group IV semiconductor layer and including semiconductor microcrystals with surfaces covered by a film having a resistivity higher than the resistivity of said semiconductor microcrystalline layer; and
    a metal layer formed on said semiconductor microcrystalline layer,
    said semiconductor microcrystalline layer having a size to exhibit a quantum confinement effect thereby permitting electrons and holes, upon application of a voltage between said Group IV semiconductor layer and said metal layer, to tunnel through said film for injection into said semiconductor microcrystalline layer so that the electrons and holes are recombined together for emission of light wherein a thickness of said semiconductor microcrystalline layer is less than or equal to 80 nanometers.

7. The semiconductor device according to claim 6, wherein said semiconductor microcrystals comprise silicon.

8. The semiconductor device according to claim 6, wherein said Group IV semiconductor layer comprises silicon.

9. The semiconductor device according to claim 1 or 6, wherein said film has thickness of less than or equal to 5 nanometers, and said semiconductor microcrystals have a size less than or equal to 10 nanometers.

10. A semiconductor device comprising:
    a p-type Group IV semiconductor layer;
    a semiconductor fine-line layer formed on said p-type Group IV semiconductor layer and including at least two semiconductor fine lines having a surface covered by an insulative film;
    an n-type Group IV semiconductor layer formed on said semiconductor fine-line layer; and
    said semiconductor fine-line layer being sized to exhibit a quantum confinement effect for permitting electrons and holes, upon application of a voltage between said p-type Group IV semiconductor layer and said n-type Group IV semiconductor layer, to tunnel through said insulative film for injection into said semiconductor fine-line layer for recombining therein for emitting light.

11. The semiconductor device according to claim 10, wherein said semiconductor microcrystalline layer has a thickness of less than or equal to 80 nanometers.

12. A semiconductor device comprising:
    a Group IV semiconductor layer having a first type of conductivity;
    a semiconductor microline layer formed on said Group IV semiconductor layer and including a semiconductor microline having a surface covered by an insulative film; and
    a metal layer formed on said semiconductor microline layer,
    said semiconductor microline layer being sized to exhibit a quantum confinement effect thereby causing electrons and holes, upon application of a voltage between said Group IV semiconductor layer and said metal layer, to tunnel through said insulative film into said semiconductor microline layer for recombination to thereby emit light wherein a thickness of said semiconductor microline layer is less than or equal to 80 nanometers.

13. The semiconductor device according to claim 10 or 12, wherein said insulative film has a thickness of less than or equal to 5 nanometers and said semiconductor microline has a longitudinal length and a lateral length each less than or equal to 10 nanometers.

14. The semiconductor device according to claim 10 or 12, wherein said semiconductor microline comprises silicon.

15. The semiconductor device according to claim 10 or 12, wherein said Group IV semiconductor layer comprises silicon.

16. A semiconductor device comprising:

a p-type Group IV semiconductor layer;

a multilayer semiconductor structure on said p-type Group IV semiconductor layer, said structure including an alternate lamination of a plurality of second Group IV semiconductor layers and a plurality of films, each second Group IV semiconductor layer having a thickness less than or equal to 10 nanometers, each film having a thickness being less than or equal to 5 nanometers and having a resistivity greater than the resistivity of said semiconductor, the alternate lamination of layers having a thickness less than or equal to 80 nanometers; and an n-type Group IV semiconductor layer formed on said multilayer semiconductor structure, wherein, upon application of a voltage between said p-type Group IV semiconductor layer and said n-type Group IV semiconductor layer, electrons and holes tunnel through said film having high resistivity for injection into said Group IV semiconductor layer for recombination of the electrons and holes for emission of light.

17. A semiconductor device comprising:

a first Group IV semiconductor layer of a first conductivity type;

a multilayer semiconductor structure disposed on said Group IV semiconductor layer, said structure including an alternate lamination of second Group IV semiconductor layers and films, each second Group IV semiconductor layer having a thickness less than or equal to 10 nanometers, each film having a thickness of less than or equal to 5 nanometers, and being greater in resistivity than the resistivity of said semiconductor, a total thickness of said laminated Group IV semiconductor layers and films being less than or equal to 80 nanometers; and a metal layer formed on said multilayer semiconductor structure, wherein, upon applying of a voltage between said Group IV semiconductor layer and said metal layer, electrons and holes tunnel through said insulative film into said second semiconductor layers for recombination leading to emission of light.

18. A semiconductor device wherein a light receiving element made of Group IV semiconductor and the semiconductor device as set forth in claims 1, 2, 3, 6, 7, 8, 10, 12,16, or 17 are provided on the same semiconductor substrate.

19. A semiconductor device wherein an integrated circuit comprising at least two transistors made of Group IV semiconductor, a resistor, a capacitor, and a light receiving element made of Group IV semiconductor, and the semiconductor device in claims 1, 2, 3, 6, 7, 8, 10, 12,16, or 17 are provided on the same semiconductor substrate.

20. A semiconductor device comprising:

a Group IV semiconductor layer having a conductivity type of a first type;

semiconductor microcrystalline layer formed on said Group IV semiconductor layer and including semiconductor microcrystals with surfaces covered by a film having a resistivity higher than the resistivity of said semiconductor microcrystalline layer; and a metal layer formed on said semiconductor microcrystalline layer, said semiconductor microcrystalline layer comprising holes in a volume equal to or less than five percent of a volume of the microcrystalline layer and having a size to exhibit a quantum confinement effect thereby permitting electrons and holes, upon application of a volt-age between said Group IV semiconductor layer and said metal layer, to tunnel through said film for injection into said semiconductor microcrystalline layer so that the electrons and holes are recombined together for emission of light.

* * * * *